United States Patent
Wulich et al.

(10) Patent No.: US 10,164,583 B2
(45) Date of Patent: Dec. 25, 2018

(54) METHOD AND SYSTEM FOR THE LINEARIZATION OF A MIMO COMMUNICATION SCHEME HAVING NONLINEAR POWER AMPLIFIERS

(71) Applicant: B. G. NEGEV TECHNOLOGIES AND APPLICATIONS LTD., AT BEN-GURION UNIVERSITY, Beer Sheva (IL)

(72) Inventors: Dov Wulich, Meitar (IL); Ilia Iofedov, Ashdod (IL)

(73) Assignee: B.G. Negev Technologies and Applications Ltd., at Ben-Gurion University, Beer Sheva (IL)

( * ) Notice: Subject to any disclaimer, the term of this patent is extended or adjusted under 35 U.S.C. 154(b) by 0 days.

(21) Appl. No.: 15/558,245

(22) PCT Filed: Mar. 13, 2016

(86) PCT No.: PCT/IL2016/050268
§ 371 (c)(1),
(2) Date: Sep. 14, 2017

(87) PCT Pub. No.: WO2016/147172
PCT Pub. Date: Sep. 22, 2016

(65) Prior Publication Data
US 2018/0048268 A1    Feb. 15, 2018

Related U.S. Application Data

(60) Provisional application No. 62/135,197, filed on Mar. 19, 2015.

(51) Int. Cl.
*H03F 1/32* (2006.01)
*H04B 7/0413* (2017.01)
*H03F 3/24* (2006.01)
*H03F 3/68* (2006.01)
*H04B 7/024* (2017.01)

(52) U.S. Cl.
CPC ......... *H03F 1/3247* (2013.01); *H03F 1/3258* (2013.01); *H03F 3/24* (2013.01);
(Continued)

(58) Field of Classification Search
CPC . H03F 1/3247; H03F 3/24; H03F 3/68; H03F 1/3258; H03F 2200/451; H04B 7/024
See application file for complete search history.

(56) References Cited

U.S. PATENT DOCUMENTS

| | | | | |
|---|---|---|---|---|
| 9,813,085 | B1* | 11/2017 | Butler | H04B 1/0458 |
| 2010/0225389 | A1* | 9/2010 | Teetzel | H03F 1/3211 |
| | | | | 330/149 |
| 2011/0002411 | A1 | 1/2011 | Forenza et al. | |
| 2012/0236964 | A1* | 9/2012 | Wulich | H04L 5/0046 |
| | | | | 375/297 |

(Continued)

OTHER PUBLICATIONS

Xiao et al., Improved linear transmit processing for single-user and multi-user MIMO communications systems, IEEE Transactions on Signal Processing, pp. 1768-1779, Dec. 31, 2008 (13 pages).

(Continued)

*Primary Examiner* — Kenneth Lam
(74) *Attorney, Agent, or Firm* — Roach Brown McCarthy & Gruber, P.C.; Kevin D. McCarthy

(57) ABSTRACT

A linearized MIMO system which includes a MIMO receiver which comprises one or more receiving units, each receiving unit comprises one or more receiving antennas and an optional MIMO spatial decoder. The linearized MIMO system also includes a linearized MIMO transmitter, which comprises a plurality of non-linear power amplifiers at respective transmission branches, where each of the non-linear power amplifiers feeds a respective antenna with an (Continued)

amplified signal. The linearized MIMO system also includes a MIMO spatial pre-coder for receiving an artificial data signal from a global linearizer, and based on a channel state information of the medium (medium-channel), the linearized MIMO system creates a plurality of transmission branch-signals. Each of the branch signals feeds one of the non-linear power amplifiers, respectively. The global linearizer receives a data signal and creates the artificial data signal.

7 Claims, 4 Drawing Sheets

(52) U.S. Cl.
CPC ............... *H03F 3/68* (2013.01); *H04B 7/024* (2013.01); *H04B 7/0413* (2013.01); *H03F 2200/451* (2013.01)

(56) References Cited

U.S. PATENT DOCUMENTS

2014/0016725 A1* 1/2014 Peroulas ............... H03F 1/3247
375/297
2015/0061762 A1* 3/2015 Charlon ............... H03F 1/3258
330/149

OTHER PUBLICATIONS

Gregorio F. et al., Power amplifier linearization technique with IQ imbalance and crosstalk compensation for broadband MIMO-OFDM transmitters, Eurasip Journal of Advances in Signal Processing, Jul. 13, 2011, (15 pages).
International Search Report for PCT/IL2016/050268, dated Jun. 27, 2016 (9 pages).
Written Opinion of the International Searching Authority for PCT/IL2016/050268, dated Jun. 27, 2016 (4 pages).

* cited by examiner

METHOD AND SYSTEM FOR THE LINEARIZATION OF A MIMO COMMUNICATION SCHEME HAVING NONLINEAR POWER AMPLIFIERS

FIELD OF INVENTION

The field of the invention relates in general to communication systems such as mobile communication or other wireless applications. More particularly, the invention relates to a system which improves power efficiency and data throughput in a MIMO system having non-linear power amplifiers.

BACKGROUND OF THE INVENTION

Transmission via multiple antennas is an excellent technique for increasing the reliability and the throughput of a communication system. The Multiple Input Multiple Output (MIMO) system is a good example for this technique. In many cases, and in order to increase the throughput and reliability, a single base applies multiple transmitting antennas, each of them is fed by a power amplifier (hereinafter "PA"). In order to obtain the potential gain of said multi-antenna transmission, a spatial precoding and decoding is typically applied at the transmitter (TX) and at the receiver (RX), respectively.

An assumption of a linear channel is commonly adopted in the design of MIMO systems. However, in practice, the MIMO channel may contain nonlinearities, mainly due to the nonlinear power-amplifiers that are used, each of them amplifies the transmitted signal before outputting it to the medium via an antenna. As noted, in order to increase the transmission power, as well as the power efficiency of the PA, it is possible to operate the PA at its non-linear region. However, in this mode of operation the PA distorts the transmitted signal, yielding performance degradation. This performance degradation results in a higher level of error rate, and out-of-band radiation (spectrum widening).

Typically, the existence of saturation levels (i.e., non-linear region) in the PA amplification curve forces the designer of a communication system to choose a proper Back-Off (BO), which influences three major parameters of the communication system: (i) power efficiency, (ii) a metric for spectral purity; and (iii) a level of bit error rate at the receiver. A "back off" is typically defined as the ratio between the maximal emitted power of the PA and the average transmitted power.

While the above problem of non-linear PA exists in most typical communication techniques, it is particularly significant in OFDM transmission and in single carrier transmission with low roll-off factor.

A common approach to reduce the nonlinear distortion is a linearization of the PA curve by compensating for the non-linear region. This approach enables enlargement of the linear dynamic range of the PA and, as a result, reduces the probability of signal distortion. This is a well-established technique, often used in systems with a single TX antenna. This technique may also be applied in a system with multiple TX antennas like in MIMO systems, where the PA in each TX branch can be linearized separately. This approach, however, has a very high implementation complexity, particularly in systems having many TX antennas, e.g., in systems of massive MIMO. Moreover, it seems that the performance of said technique is not optimal, and can be improved in terms of power efficiency, spectral purity, and data reliability.

It is an object of the present invention to provide a transmission structure for increasing the power efficiency of a multi-antenna transmitter and increasing the data throughput of the system, or alternatively reducing the level of error rate. All said advantages are sought to be obtained without harming the spectral purity of the transmitted signals.

It is another object of the present invention to obtain said objects by implementing said transmission structure in a compact digital processing at the transmission side.

It is still another object of the invention to provide said transmission structure without any modification at the receiving side.

It is still another object of the invention to increase by said a transmission structure the efficiency and performance of mobile base stations.

Other objects and advantages of the invention will become apparent as the description proceeds.

SUMMARY OF THE INVENTION

The invention relates to a linearized MIMO system which comprises: (a) a MIMO receiver which comprises one or more receiving units, each receiving unit comprises: (a.1) one or more receiving antennas; and (a.2) an optional MIMO spatial decoder; and (b) a linearized MIMO transmitter, which comprises: (b.1) a plurality of non-linear power amplifiers at respective transmission branches, each of said non-linear power amplifiers feeding a respective antenna with an amplified signal; (b2) a MIMO spatial pre-coder for receiving an artificial data signal from a global linearizer, and based on a channel state information of the medium (medium-channel), creating plurality of transmission branch-signals, each of said branch signals feeding one of said non-linear power amplifiers, respectively; and (b3) said global linearizer receiving a data signal and creating said artificial data signal.

In an embodiment of the invention, said global linearizer receives said data signal, and in turn creates said artificial data signal based on a model of the entire MIMO system, including: (i) said MIMO spatial pre-coder; (ii) each of said non-linear power amplifiers; (iii) the MIMO medium-channel; and (iv) the MIMO spatial decoder, when exists, at each of said receivers.

In an embodiment of the invention, said artificial signal is created with the aim of obtaining an output signal from said one or more receivers which is closest to said data signal at the transmitter.

In an embodiment of the invention, said linearized MIMO system further comprises a spectral purifier at each of said transmission branches for limiting the bandwidth of the transmitted signal from each branch respectively, said spectral purifier being located between said spatial pre-coder and a non-linear power amplifier, respectively, and wherein said global linearizer further bases said artificial data signal on characteristics of said spectral purifier.

In an embodiment of the invention, said global linearizer is designed to perform an iterative process, said global linearizer comprises: (a) a model of the entire MIMO system for iteratively receiving a temporary artificial data signal, creating a modeled received signal of said one or more receivers, and returning said modeled received signal into a first adder; (b) said first adder for receiving said data signal and said modeled received signal, for subtracting said modeled received signal from said data signal to form an error signal, and for forwarding said error signal to a second adder; (c) a second adder for receiving said error signal and a temporary artificial data signal from a previous iteration, adding said two signals to form a new temporary artificial data signal; and (d) a threshold comparison unit for comparing the level of said error signal to a predefined threshold, and upon finding that said error signal is below said threshold, terminating the iterative process, and outputting said temporary artificial data signal as said artificial data signal to said spatial pre-coder that in turn creates said plurality of transmission branch-signals for the real life PAs.

In an embodiment of the invention, said threshold comparison unit counts the number of iterations and terminates the process upon reaching a predefined maximal number of iterations.

In an embodiment of the invention, said linearized MIMO system comprises a single antenna at the receiver.

DETAILED DESCRIPTION OF PREFERRED EMBODIMENTS

Figure 1:
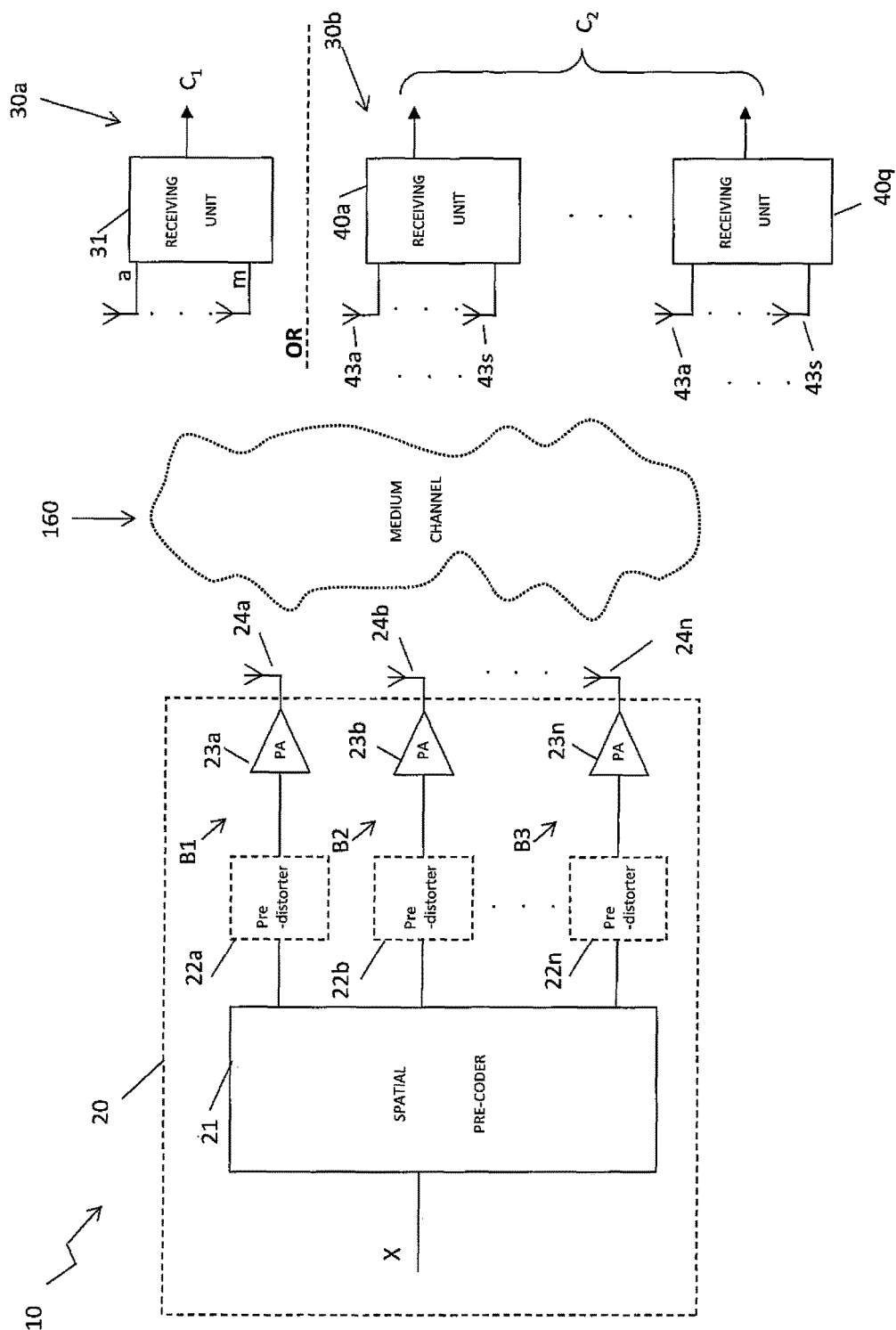
FIG. 1 discloses two types of typical MIMO schemes according to the prior art.

FIG. 1 discloses two types of typical MIMO schemes 10 according to the prior art. The first type is "point to point" scheme, where a transmitter 20 transmits single or multiple data streams to a single receiver 30a (having a single receiving unit 31). The second type of MIMO system is a "point to multi-point" scheme, where a transmitter 20 transmits a data stream for each of separated multiple receiving unit 40a-40q (of receiver 30b). A MIMO spatial pre-coder 21 of a transmitter 20, which is defined based on the channel (medium) state information, receives a complex valued data signal X representing samples of the single carrier or OFDM modulated signal. The spatial pre-coder 21 creates n separate signals for transmission from n transmitting branches of transmitter 20, respectively. The receiver 30a in the "point to point" alternative scheme comprises m receiving antennas within one receiving unit 31, which jointly processes all the m received signals using a MIMO spatial decoding technique (which is defined based on the channel state information), which results in a processed received signal $C_1$. The "point to multi-point" alternative scheme in turn has multiple receiving units 40a, 40b . . . 40q, while each receiving unit may comprise one or more antennas 43a . . . 43s. Each receiving unit reconstructs its own data stream while not considering signals of other receiving units, while the output result is a unified signal $C_2$.

As noted above, each branch the MIMO transmitter 20 contains a nonlinear PA which amplifies its own transmitted signal before outputting it to the medium via the respective antenna. In order to avoid distortions, the designer may prefer to operate in the linear region of the PA curve. However, an operation only within the linear region of the PA curve involves low power efficiency, and relatively low transmission power. The alternative approach for increasing the transmission power, as well as the power efficiency of the PA, operates the PA at its non-linear region. However, the operation of the PA within its non-linear region distorts the transmitted signal, which in turn results in performance degradation. More specifically, said performance degradation results in a higher level of error rate at the receiver, and spectrum widening of the transmitted signals. Therefore, to reduce said distortion at the output of the PA 23a, 23b, . . . 23n, the prior art commonly applies a pre-distorter 22a, 22b, . . . 22n which "linearizes" the PA curve in an artificial manner. More specifically, said pre-distorter 22 is applied separately in each of the n transmission branches. In this scheme, each pre-distorter locally views and considers only its own signal, without any global view or consideration whatsoever of the signals of the one or more other branches of the transmitter 20. The inventors have found that this local view and consideration by each transmission branch in said prior art scheme is not optimal and can be improved.

Figure 2:
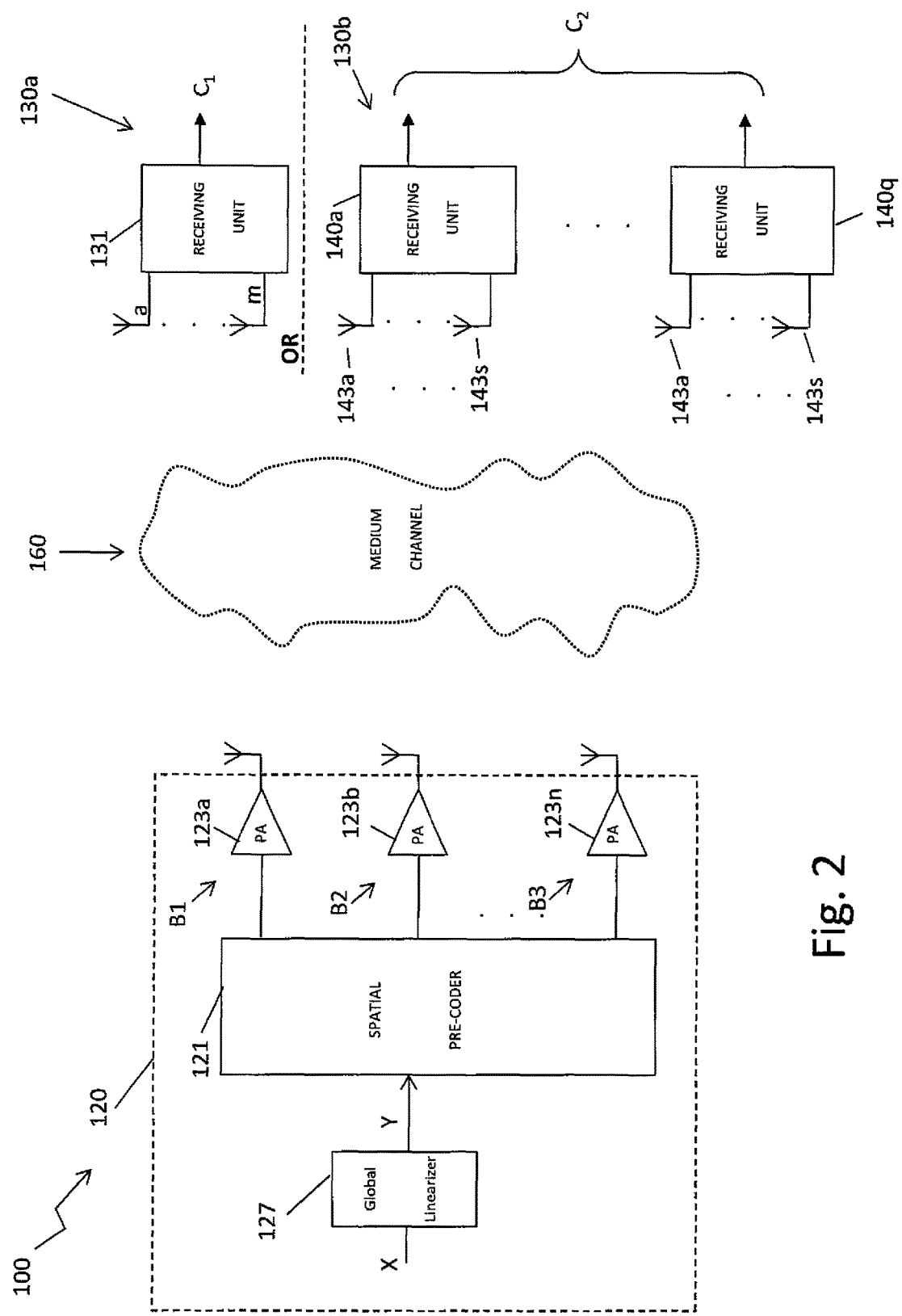
FIG. 2 illustrates in a general block diagram form a structure of a linearized MIMO system according to an embodiment of the present invention.

FIG. 2 illustrates in a general block diagram form a structure 100 of a linearized MIMO system according to an embodiment of the present invention. While in the prior art scheme of FIG. 1 a local pre-distorter was used in each transmission branch, the system of FIG. 2 uses a global linearizer 127. The global linearizer 127 receives the data signal X, considers (i) the MIMO spatial pre-coder 121; (ii) the impact of all the non-linear power amplifiers 123a, 123b, . . . 123n; (iii) the MIMO medium channel 160; and (iv) the MIMO spatial decoding of the receiving unit or receiving units (131 or 140 respectively). The global consideration of all the above is done with the aim to construct an "artificial" data signal Y which will ensure a desired data signal, $C_1$ or $C_2$ respectively, at the output of the receiver 130a (comprising one receiving unit) or of receiver 130b (which comprises a plurality of receiving units) respectively.

The global linearizer 127 requires for its operation the knowledge of: (i) the channel state information, namely model of the medium 160; and (ii) the non-linear characteristics of the PAs 123. While the knowledge of the non-linear characteristics of each specific PA 123a, 123b, . . . 123n is desired, the invention may assume a same nominal non-linear characteristic for all the PAs.

Figure 3:
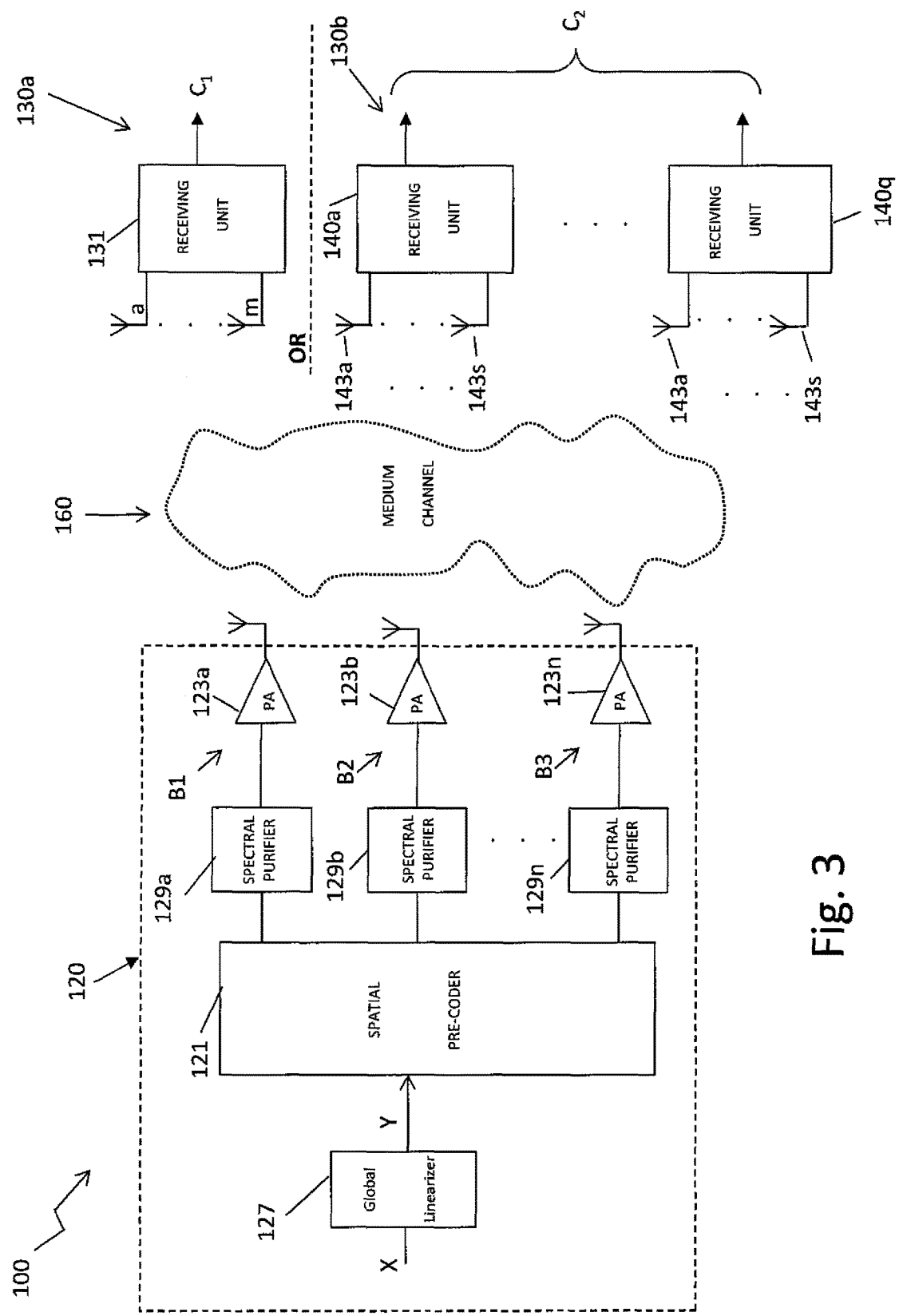
FIG. 3 illustrates in a general block diagram form a structure of a linearized MIMO system according to still another embodiment of the present invention, which comprises a spectral purifier at each transmission branch.

The scheme of FIG. 2 assumes that the spectral purity requirements are not strict. However, if a necessity arises to maintain a spectrum according to a given spectral mask of the transmitted signal, a spectral purifier 129a, 129b, . . . 129n may be used in each transmitting branch $B_1$, $B_2$, . . . $B_n$, as shown in FIG. 3.

Figure 4:
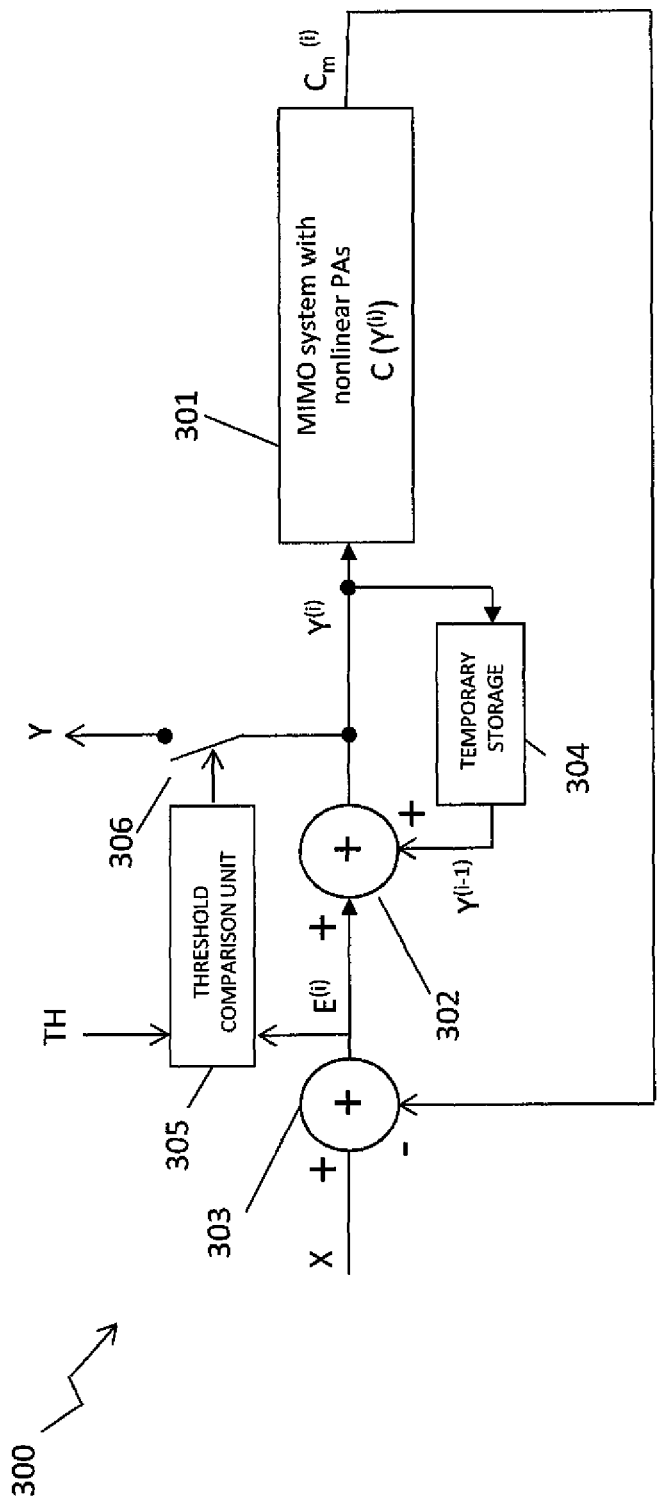
FIG. 4 illustrates in a block diagram form a linearized MIMO structure and respective process, according to an embodiment of the present invention.

FIG. 4 illustrates a block diagram form a linearized MIMO structure and respective process 300 which is performed according to the present invention. More specifically, the structure of FIG. 4 is an example for the structure of the global linearizer 127 of FIG. 3. Block 301 is a model which represents the entire MIMO system, including: (i) the MIMO spatial pre-coder 121; (ii) the spectral purifiers 129a, 129b, . . . 129n (if applied) (iii) the non-linear power amplifiers 123a-123n; (iv) the MIMO medium channel 160; and (v) the MIMO spatial decoding of the receiving unit or receiving units (131 or 140 respectively). Model 301 is created based on the knowledge relating to (i) the channel state information, namely model of the medium 160; and (ii) the non-linear characteristics of the PAs 123 mentioned above. Signal X represents a data signal which is desired to transmit to the receiver (130a or 130b, respectively in FIG. 3). The transmission of the data signal X will result in an erroneous signal at the output of the receiver, in view of the effect of the non-linearity of the PAs (123a-123n) at the transmitter. The system of FIG. 4, instead, produces an "artificial" data signal Y, which, when inputted into the pre-coder 121, will result in an optimal signal ($C_1$ or $C_2$) at the output of the receivers (130a or 130b, respectively in FIG. 3). As shown, the model 301 represents the entire channel from the entry into the pre-coder 121 up to the received signal at the output of the decoder at the receiver (130a or 130b, respectively). Having this model 301, the process of the present invention determines an optimal input signal Y to the pre-coder 121 which will yield the received signal $C_m^{(i)}$ at the output of the model. Having said "artificial" data signal Y, which is transmitted through the real MIMO system, the received signal $C_1$ or $C_2$ is close the desired data signal X. More specifically, and as will be elaborated hereinafter, the signal at the output of the receiver is improved compared to the prior art scheme of FIG. 1.

The process of FIG. 4 is an iterative process. A signal $Y^{(i)}$ represents a modeled input (in iteration i) to the MIMO spatial pre-coder 121. Said signal $Y^{(i)}$ is provided to the input of model 301, resulting in a modeled output signal of the receiver $C_m^{(1)}$. The modeled output signal (which in fact considers the pre-coding, PAs, the medium channel, and the decoding, all are known at the transmitter), is returned to adder 303, and subtracted from the data signal X, resulting in an error signal $E^{(i)}$. This error signal $E^{(i)}$ is used to modify the input signal to the model block 301. More specifically, the error signal $E^{(i)}$ is added by means of second adder 302 to the previous input signal $Y^{(i-1)}$, which is stored in temporary storage 304. The result of this summation is in fact the signal $Y^{(i)}$. This iterative process is a convergence process which is repeated several times until (a) the norm of error signal $E^{(i)}$ is determined by the threshold comparison unit 305 to be below a predefined threshold TH. More specifically, and following each iteration, the threshold comparison unit 305 compares the norm of the error signal $E^{(i)}$ to a predefined TH level, and when the level of the error signal $E^{(i)}$ is found to be below TH, the threshold comparison unit closes switch 306, thereby to output the artificial data signal Y into the spatial pre-coder 121, and terminate the iteration process until a next data signal X is required to be transmitted, in which case this procedure is repeated. Alternatively, (b) instead of terminating the process and outputting the artificial signal when the error signal is found to be below the threshold level, the threshold comparison unit 305 may terminate the process, and output the artificial signal Y when a predefined number of iterations is reached. When either one of said conditions (a) or (b) are met, the signal Y is fed into the MIMO spatial pre-coder 121 (see FIG. 3), to be pre-coded and transmitted to the medium.

The description of the scheme of FIG. 4 is general, and provides one example for carrying out the invention. This general scheme has not considered (i) whether the signal X contains a single data stream or multiple data streams; (ii) whether the signal X is a single-carrier or an OFDM modulated; (iii) whether the medium-channel is flat or frequency selective; and (iv) whether the type of the MIMO system is a point-to-point system or point-to-multi-point system. However, the structure and process of the invention can easily be adapted to consider one or more of said issues (i)-(iv), if necessary.

A detailed description of the block 301 of FIG. 4 is given below. As an example, a point-to-point system with a single data stream transmitted through a flat channel (i.e., a channel without reflections) is considered. For this case the data signal X is a scalar signal representing samples of an OFDM or a single carrier modulated signal. The medium-channel is given by (m×n) matrix $\underline{H}$. For a point-to-point system the Singular Value Decomposition (SVD) of the channel matrix $\underline{H}$ is typically applied to derive MIMO spatial pre-coding and decoding. The result of the SVD is given by $\underline{H}=\underline{U\Sigma V}^H$, where $\underline{\Sigma}$ is a singular values matrix, $\underline{U}$ and $\underline{V}$ are unitary matrices. Since a single data stream is considered, the pre-coding is represented by vector V given by a column of the matrix $\underline{V}$ associated with the greatest singular value, $\lambda_1$, in matrix $\underline{\Sigma}$. Similarly, the decoding is given by vector $U_1$ obtained as a column of the matrix $\underline{U}$ associated with $\lambda_1$. The decoding vector $U=U_1/\lambda_1$ is normalized, such that $U^H\underline{H}V=1$.

For an "artificial" input signal Y, when linear PAs are assumed, the model of the noiseless received signal is given by $C=U^H\underline{H}VY=Y$. On the other hand, when nonlinear PAs are considered, the noiseless received signal is given by:

$$C=U^H\underline{H}g(VY), \qquad (1)$$

where g(·) is a function representing the nonlinear characteristic of the PA (here the same PA model is assumed in all transmitting branches). Eq. (1) above describes the mathematical model of the MIMO system with nonlinear PAs represented by the block 301 of FIG. 4.

An important aspect of the invention is the definition of the system model as in Eq. (1). Having this model, a linearization of the entire nonlinear MIMO channel can be performed. The aim of the linearization is to find a transmitted signal Y, such that the received signal C ($C_1$ or $C_2$ in FIG. 3) will be equal to the desired data signal X. Namely, it is necessary to find Y that solves the nonlinear equation $$X=V^H\underline{H}g(UY). \qquad (2)$$

For this aim, numerical methods for solving nonlinear equations can be applied. One of these solution methods is presented in FIG. 4. The structure and process of FIG. 4 is based on the "fixed point iterations" technique, which enables the finding of a fixed point of some function Φ(·) by simple iterations, while the definition of the fixed point, $Y_0$, is a point where $Y_0=\Phi(Y_0)$.

To apply this numerical process an error signal is defined at the i-th iteration as $$E^{(i)}=X-U^H\underline{H}g(VY^{(i)}). \qquad (3)$$

Next, we define an update rule for input signal $Y^{(i)}$ is defined, which is denoted by function $\Phi(Y^{(i)})$ $$Y^{(i+1)}=\Phi(Y^{(i)})=Y^{(i)}+E^{(i)}. \qquad (4)$$

Once the fixed point is achieved, i.e., $Y^{(i+1)}=\Phi(Y^{(i)})=Y^{(i)}$, the error signal in fact becomes 0, which means that $Y^{(i)}$ solves Eq. (2). It can be analytically shown that for a monotonically increasing nonlinear characteristic of the PAs, the iterative process converges to zero or to a constant error, depending on the desired data signal X.

As noted above, the process of FIG. 4 is an iterative process. Preferably, this iterative process is terminated when the norm of the error signal ($E^{(i)}$ in FIG. 4) goes below a predefined threshold TH. Any time when said termination occurs, the aid termination occurs, the current $Y^{(i)}$ signal is conveyed to the pre-coder 121 as signal Y for transmission. This process repeats for each new data signal X. It should be noted that so far the discussion did not take into consideration the noise at the receiver. However, noise does exist, and it degrades the received signal, even when an exact solution of Eq. (2) is obtained. Therefore, in order to reduce complexity, the procedure of the invention may terminate the iterations, for example, when the norm of the error signal becomes lower than a threshold TH, which is in turn chosen to be proportional to the noise power at the receiver.

The above analysis may also be applied for an OFDM transmission through a frequency selective channel. For this case, the spatial pre-coding and decoding are applied per subcarrier, resulting in a system of multi-dimensional nonlinear equations, similar to Eq. (2), which formulates the linearization problem for a MIMO frequency selective channel with nonlinear PAs. An iterative solution of this system may be performed according to the proposed iterative scheme of FIG. 4.

The same approach may also be applied, for a multi-stream which is in turn applied in a point-to-point system or a point-to-multipoint system, where the data signal X is represented by a vector (in a flat channel case) or a matrix (in an OFDM structure with a frequency selective channel case). The only difference between the point-to-point alternative or the point-to-multipoint alternative is the definition of pre-coding and decoding matrices. For instance, in the point-to-point alternative system an SVD based pre-coding and decoding may be applied, while in the point-to-multipoint a zero forcing precoding may be used, as is commonly done in space-division multiple access (SDMA) systems.

The spectral purifier 129 will now be discussed in more details. As mentioned above, the transmission through nonlinear PAs results in spectral widening of the signal. This issue is very important in cases where the transmitted signal has to meet some spectral purity limitations, as dictated, for example, by spectrum management agencies. In order to reduce the out-of-band radiation, the invention applies, in one example, a spectral purifier 129 (see FIG. 3). One approach for implementing the purifier 129 uses an iterative clipping and filtering (ICF) technique. This technique may be applied on the signal before its transmission, in the digital domain. For example, the transmitted signal in each branch passes an ICF process, and then proceeds to and analog front-end containing the nonlinear PA.

The ICF technique reduces the out-of-band distortion, but it may increase the in-band part of the distortion, a phenomenon which in turn has a direct impact on the error rate at the receiver. In order to overcome this problem, a spectral purifier 129 may be used in the MIMO system modeling. In that case, the model of the MIMO system of Eq. (1) and the linearization of Eq. (2) may be modified, appropriately.

The linearization structure of the invention, when applied to a MIMO system with nonlinear PAs may improve the power efficiency of the PAs at the transmitter by 3-6 dB as compared to the standard structure; Moreover, the structure of the invention may be tuned to any spectral mask requirement. The link budget of the system can be improved by 3-6 dB—this gain can be used to extend the range of transmission with a given data-throughput, or to increase the data throughput for a given range of transmission.

The invention claimed is:

1. A linearized MIMO system which comprises:
   a. a MIMO receiver which comprises one or more receiving units, each receiving unit comprises:
      one or more receiving antennas;
      an optional MIMO spatial decoder; and
   b. a linearized MIMO transmitter, which comprises:
      a plurality of non-linear power amplifiers at respective transmission branches, each of said non-linear power amplifiers feeding a respective antenna with an amplified signal;
      a MIMO spatial pre-coder for receiving an artificial data signal from a global linearizer, and based on a channel state information of a medium, creating plurality of transmission branch-signals, each of said branch signals feeding one of said non-linear power amplifiers, respectively; and
      said global linearizer receiving a data signal and creating said artificial data signal.

2. A linearized MIMO system according to claim 1, wherein said global linearizer receives said data signal, and in turn creates said artificial data signal based on a model of said MIMO system, including: (i) said MIMO spatial pre-coder; (ii) each of said non-linear power amplifiers; (iii) a MIMO medium-channel; and (iv) the MIMO spatial decoder, when exists, at each of said receivers.

3. A MIMO system according to claim 2, wherein said artificial signal is created with the aim of obtaining an output signal from said one or more receivers which is closest to said data signal at the linearized MIMO transmitter.

4. A linearized MIMO system according to claim 2, wherein said global linearizer is designed to perform an iterative process, said global linearizer comprises:
   a. a model of the entire MIMO system for iteratively receiving a temporary artificial data signal, creating a modeled received signal of said one or more receivers, and returning said modeled received signal into a first adder;
   b. said first adder for receiving said data signal and said modeled received signal, for subtracting said modeled received signal from said data signal to form an error signal, and for forwarding said error signal to a second adder;
   c. a second adder for receiving said error signal and a temporary artificial data signal from a previous iteration, adding said two signals to form a new temporary artificial data signal; and
   d. a threshold comparison unit for comparing a level of said error signal to a predefined threshold, and upon finding that said error signal is below said threshold, terminating the iterative process, and outputting said temporary artificial data signal as said artificial data signal to said spatial pre-coder that in turn creates said plurality of transmission branch-signals.

5. A linearized MIMO system according to claim 4, wherein said threshold comparison unit counts a number of iterations and terminates the iterative process upon reaching a predefined maximal number of iterations.

6. A linearized MIMO system according to claim 1, which further comprises a spectral purifier at each of said transmission branches for limiting a bandwidth of the transmitted signal from each branch respectively, said spectral purifier being located between said spatial pre-coder and a non-linear power amplifier, respectively, and wherein said global linearizer further bases said artificial data signal on characteristics of said spectral purifier.

7. A linearized MIMO system according to claim 1 which comprises a single antenna at the receiver.

* * * * *